(12) United States Patent
Cabral, Jr. et al.

(10) Patent No.: US 6,909,145 B2
(45) Date of Patent: Jun. 21, 2005

(54) METAL SPACER GATE FOR CMOS FET

(75) Inventors: Cyril Cabral, Jr., Ossining, NY (US); Lawrence A. Clevenger, LaGrangeville, NY (US); Louis L. Hsu, Fishkill, NY (US); Joseph F. Shepard, Jr., Fishkill, NY (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/252,661

(22) Filed: Sep. 23, 2002

(65) Prior Publication Data

US 2004/0056285 A1 Mar. 25, 2004

(51) Int. Cl.[7] .......................... H01L 29/76; H01L 29/94; H01L 31/062; H01L 31/113; H01L 31/119
(52) U.S. Cl. ...................... 257/336; 257/344; 257/408
(58) Field of Search ............................. 257/336, 344, 257/351–385, 407, 412

(56) References Cited

U.S. PATENT DOCUMENTS

| | | | |
|---|---|---|---|
| 4,716,131 A | | 12/1987 | Okazawa et al. |
| 4,859,620 A | * | 8/1989 | Wei et al. ................ 438/305 |
| 5,254,866 A | * | 10/1993 | Ogoh ...................... 257/369 |
| 5,371,391 A | * | 12/1994 | Sato ........................ 257/387 |
| 5,621,236 A | * | 4/1997 | Choi et al. ............... 257/389 |
| 5,658,815 A | | 8/1997 | Lee et al. |
| 5,714,786 A | * | 2/1998 | Gonzalez et al. ......... 257/366 |
| 5,753,546 A | | 5/1998 | Koh et al. |
| 5,920,783 A | | 7/1999 | Tseng et al. |
| 5,989,996 A | * | 11/1999 | Kishi ...................... 438/621 |
| 6,005,273 A | * | 12/1999 | Gonzalez et al. ......... 257/366 |
| 6,010,954 A | * | 1/2000 | Ho et al. ................. 438/596 |
| 6,043,545 A | * | 3/2000 | Tseng et al. .............. 257/408 |
| 6,057,583 A | * | 5/2000 | Gardner et al. .......... 257/408 |
| 6,100,191 A | * | 8/2000 | Lin et al. ................. 438/661 |
| 6,107,200 A | * | 8/2000 | Takagi et al. ............ 438/685 |
| 6,114,765 A | * | 9/2000 | Fujii et al. ............... 257/757 |
| 6,133,124 A | * | 10/2000 | Horstmann et al. ...... 438/525 |
| 6,184,117 B1 | * | 2/2001 | Lu .......................... 438/592 |
| 6,187,636 B1 | | 2/2001 | Jeong |
| 6,238,988 B1 | * | 5/2001 | Hsiao et al. .............. 438/305 |
| 6,316,344 B1 | * | 11/2001 | Jenq ....................... 438/592 |
| 6,399,451 B1 | * | 6/2002 | Lim et al. ................ 438/303 |
| 6,462,390 B1 | * | 10/2002 | Chen et al. ............... 257/412 |
| 6,486,496 B2 | * | 11/2002 | Chang et al. ............. 257/70 |
| 6,492,670 B1 | * | 12/2002 | Yu .......................... 257/284 |
| 6,677,201 B1 | * | 1/2004 | Bu et al. ................. 438/257 |
| 6,774,000 B2 | * | 8/2004 | Natzle et al. ............ 438/300 |
| 6,798,028 B2 | * | 9/2004 | Horstmann et al. ...... 257/412 |
| 6,806,157 B2 | * | 10/2004 | Yang et al. .............. 438/306 |
| 2001/0016362 A1 | * | 8/2001 | Brooks et al. ............ 438/4 |
| 2002/0003273 A1 | * | 1/2002 | Dawson et al. .......... 257/413 |
| 2002/0066935 A1 | * | 6/2002 | Shimizu et al. .......... 257/412 |
| 2002/0167041 A1 | * | 11/2002 | Tseng ...................... 257/315 |

FOREIGN PATENT DOCUMENTS

WO   WO0188991   11/2001

* cited by examiner

*Primary Examiner*—Tom Thomas
*Assistant Examiner*—Jesse A. Fenty
(74) *Attorney, Agent, or Firm*—McGinn & Gibb, PLLC; Wan Yee Cheung, Esq.

(57) ABSTRACT

A method and structure for a metal oxide semiconductor transistor having a substrate, a well region in the substrate, source and drain regions on opposite sides of the well region in the substrate, a gate insulator over the well region of the substrate, a polysilicon gate conductor over the gate insulator, and metallic spacers on sides of the gate conductor.

28 Claims, 6 Drawing Sheets

METAL SPACER GATE FOR CMOS FET

BACKGROUND OF THE INVENTION

1. Field of the Invention

The present invention generally relates to semiconductor manufacturing, and more particularly to structural and material processing for complementary metal oxide semiconductor devices.

2. Description of the Related Art

Polysilicon is the standard gate material used for advanced complementary metal oxide semiconductor (CMOS) devices. While the use of polysilicon in CMOS gates is attractive due to wide use in the semiconductor industry, it suffers from several disadvantages. For example, the sheet resistance of polysilicon is high (approximately 150 Ohms/Sq.), which leads to timing delays, and the polysilicon must be encapsulated by wide oxide/nitride spacers to prevent interaction with contacts.

Using metal for the gate, drain and source to lower electrical resistance has previously been disclosed in U.S. Pat. Nos. 6,057,583; 6,165,858; 6,033,963; 6,130,123; and 6,049,114, the complete disclosures of which are herein incorporated by reference. For example, in U.S. Pat. No. 6,057,583, it is disclosed to use a metal gate to connect directly to the gate dielectric, and to use metal(s) to form contacts at the source and drain regions. U.S. Pat. No. 6,165,858 teaches the use of metals to form silicide contacts at the source and drain regions. U.S. Pat. No. 6,049,114 describes a process to make a metal gate directly over the gate dielectric, and uses layers of metal silicide to control the work function and to provide a low resistance gate contact.

However, one complication of using metal as the gate contact material is that the design of the transistor device needs to accommodate the different work functions of metal compared to polysilicon. For example, nickel (Ni), tantalum nitride (TaN), ruthenium oxide (RuO), and molybdenum nitride (MoN) are more compatible with P-type doped polysilicon, and ruthenium (Ru), tantalum (Ta), and tantalum silicon silicide (TaSi$_2$) are more compatible with N-type doped polysilicon with mid-bandgap metals, such as tungsten (W), it is difficult to achieve a small threshold voltage.

Another complication is that a reliable liner is needed to prevent metal diffusion into the silicon and the gate dielectric, leading to device breakage. FIGS. 1 and 2 show typical semiconductor structures, including gate contacts, from U.S. Pat. No. 6,130,123 (FIG. 1) and U.S. Pat. No. 6,057,583 (FIG. 2).

FIG. 1 shows substrate 1100 with the shallow trench isolation structures 1110 after the further processing step of forming the nMOS device 191 and pMOS device 192 utilizing tuned metal gate electrodes 1130 and 190 over an active area or cell region denoted by p-type well 105 and n-type well 115, respectively. The nMOS device 191 includes a metal gate electrode 1130 having a work function corresponding approximately to the work function of the n-type doped silicon, with n-type doped diffusion or junction region 195. Similarly, the pMOS device 192 has a metal gate electrode 190 having a work function corresponding approximately to the work function of p-type doped silicon, with p-typed doped silicon diffusion or junction region 200 formed in the substrate. Isolation spacers 152 of a suitable dielectric are incorporated around the gate electrode 1130 and gate electrode 190 to insulate the individual electrodes of the transistor devices. Finally, FIG. 1 as an example, illustrates the coupling of nMOS transistor device 191 and pMOS transistor device 192 for an inverter.

FIG. 2 illustrates a polysilicon layer deposited over dielectrics 46 and 48, and spacers 44 on a substrate 1120. Isolation regions 22 are formed within the semiconductor substrate 20 to isolate the subsequently-formed transistor from adjacent transistors. Portions of the polysilicon layer are subsequently removed, so that a polysilicon gate conductor 64 is formed. Remaining portions 66 of the polysilicon layer are separated from source/drain regions 160 by spacers 44.

One common feature in the conventional devices is that they all employ at least one set of sidewall spacers made of insulator material surrounding the metal gate. In U.S. Pat. No. 6,049,114, the spacers enable the introduction of a gradient of dopants in the source and drain region by ion implantation. In U.S. Pat. Nos. 6,130,123 and 6,057,583, the spacers are used to insulate the metal gate from the source and drain regions of the transistor. Furthermore, anisotropic etching processes are used to form the spacers. In U.S. Pat. Nos. 6,057,583 and 6,033,963 sacrificial/dummy structures are first formed and anchored, and then the sidewall spacers are formed and defined. These sacrificial structures are removed later and replaced as the source/drain and gate structures respectively in these two conventional devices.

SUMMARY OF THE INVENTION

In view of the foregoing and other problems, disadvantages, and drawbacks of the conventional MOS devices, the present invention has been devised, and it is an object of the present invention to provide a MOS device structure using a conventional polysilicon gate with metal sidewall spacers. With the invention properties of the MOS gates are well controlled, and the gate conductivity is greatly improved.

The present invention provides a method of forming MOS devices having a polysilicon gate with metal sidewall spacers. The present invention provides a new metal deposition method to fill metal into a very small area, such as in the spacers. The present invention provides thin metallic spacers having a much lower gate sheet resistance than conventional devices. The present invention provides a CMOS device having smaller timing delays than conventional devices. The present invention provides metallic spacers having widths less than the design ground rules which allows sub-minimum lithographic wiring to be realized.

In order to attain the objects suggested above, there is provided, according to one aspect of the invention a metal oxide semiconductor device, or complementary device, and a method to form the same. A polysilicon gate conductor is disposed over a gate dielectric, which is disposed over the substrate. Then, conductive metallic spacers are formed around the gate conductor. Next an oxide wall (insulator) is formed around the metallic spacers.

The metallic spacers are formed from one of W, WN, Co, Ni, Re, Ti, TiN, Ru, RuO$_2$, Ir, Pt, Ta, TaN, TaSiN, Cr, Mn, Al, Pd, Cu, Au, and/or a combination thereof. Moreover, the device has one or more isolation layers, which isolate the metallic spacers from the source and drain regions. The conductive metallic spacers are formed by performing a CVD or ALD deposition of metal nitride films. This process involves preheating a chamber with a first set of predetermined parameters. Then, the surface of the substrate is prepared. Next, a metal precursor is introduced at a second set of predetermined parameters. After which, the substrate and metal precursor are oxidized. Finally, NH$_3$ gas with purity levels of at least 99.999%, is introduced at a third set of predetermined parameters. Optionally, one of Zn, $H_2$, and H radicals vapor are applied after oxidizing the substrate and metal precursor.

Conventional structures use either a metal gate or poly gate. The invention uses a polysilicon gate claded by a metal spacer. This combines the advantages of lower contact resistance (metal clad to assist current conduct), and minimal work function difference (polysilicon gate) between the gate conductor and channel of the FET.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

The present invention encapsulates the polysilicon gate with thin metallic spacers. This offers several advantages over conventional devices. For example, the thin metallic spacers of the present invention have a much lower sheet resistance of 2–5 Ohms/Sq. compared with the 150 Ohms/Sq. for the polysilicon gate. Thus, with the metallic spacers connected to the polysilicon gate, the present invention obtains a much lower overall gate sheet resistance, and thus has smaller timing delays compared to the prior art devices. The present invention provides metallic spacers, which have widths less than the design ground rule, which in turn, enables sub-minimum lithographic wiring to be realized.

Figure 1:
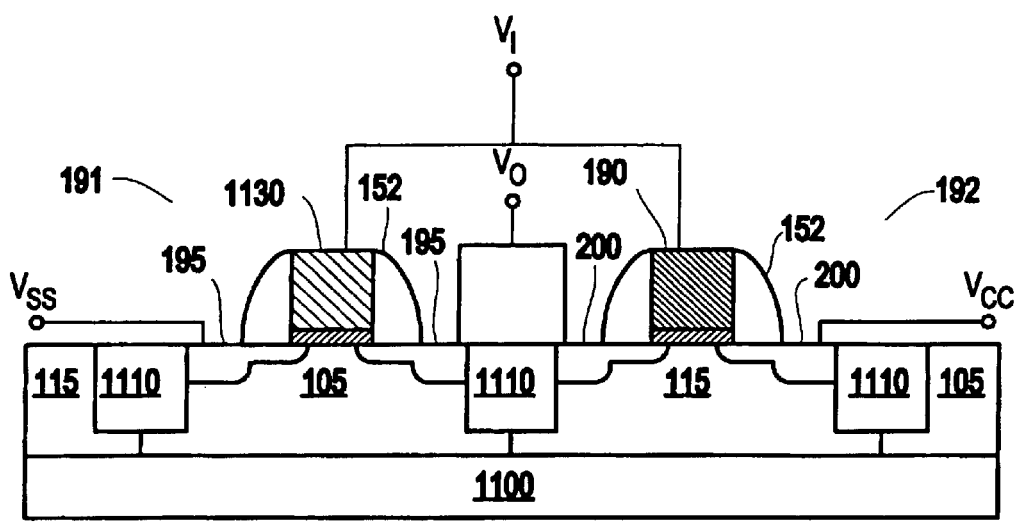
FIG. 1 is a cross-sectional schematic diagram of a conventional semiconductor device.
Figure 2:
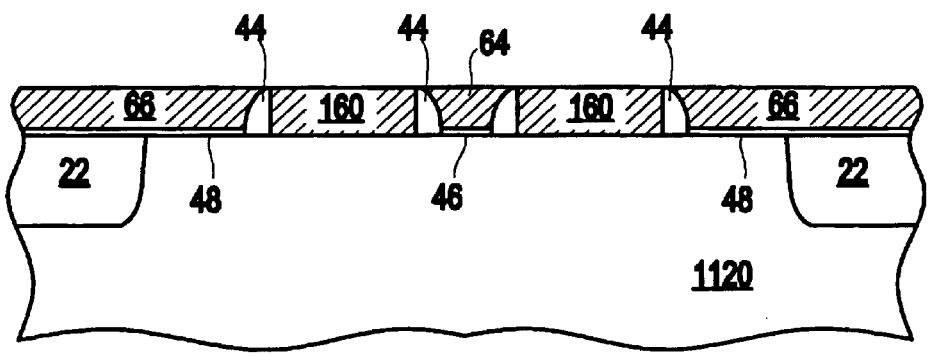
FIG. 2 is a cross-sectional schematic diagram of a conventional semiconductor device.
Figure 3:
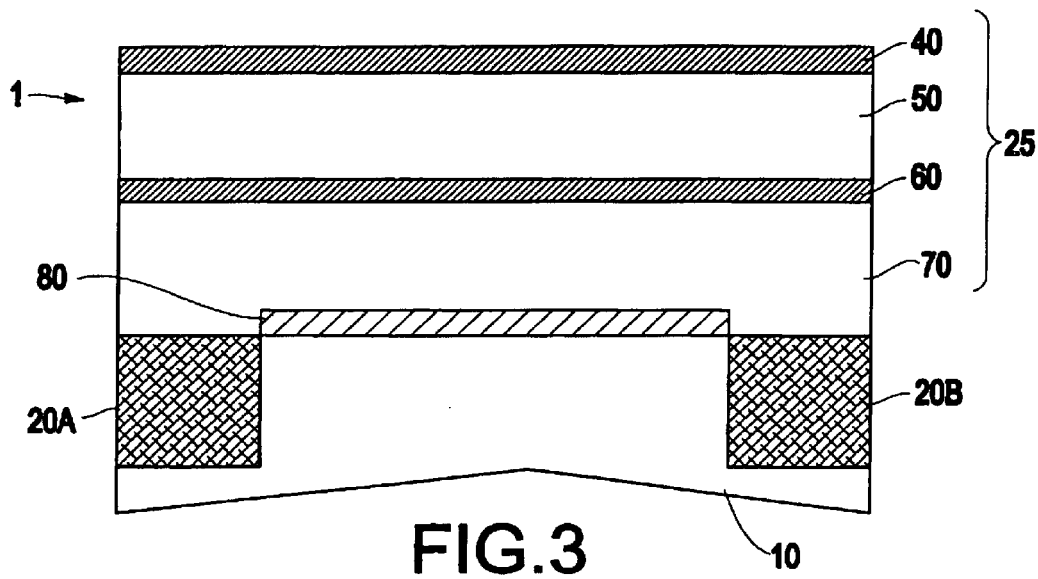
FIG. 3 is a cross-sectional schematic diagram of a partially completed CMOS device according to the present invention.

Referring now to the drawings, and more particularly to FIGS. 3 through 14, there are shown preferred embodiments of the method and structures according to the present invention. Specifically, FIG. 3 illustrates a MOS device 1 comprising a semiconductor substrate 10 (e.g., silicon and III–V compound) having proper type of wells; e.g. n-well and p-well are used as the starting materials. A generic compound made from an element in Group III and another element from Group V in the periodic table, e.g. GaAs, InP. Shallow trench isolation regions 20A, 20B are formed in the substrate 10 for device isolation. A gate dielectric material 80, such as thermal oxide, CVD oxide, oxynitride, or any proper high-k dielectric is formed upon the substrate layer 10.

Next, a composite stack of material 25 comprising a gate conductor 70, a first nitride layer 60, an oxide layer 50, and a second nitride layer 40 are deposited consecutively. The gate conductive material 70 is preferably a doped layer of CVD polysilicon.

Figure 4:
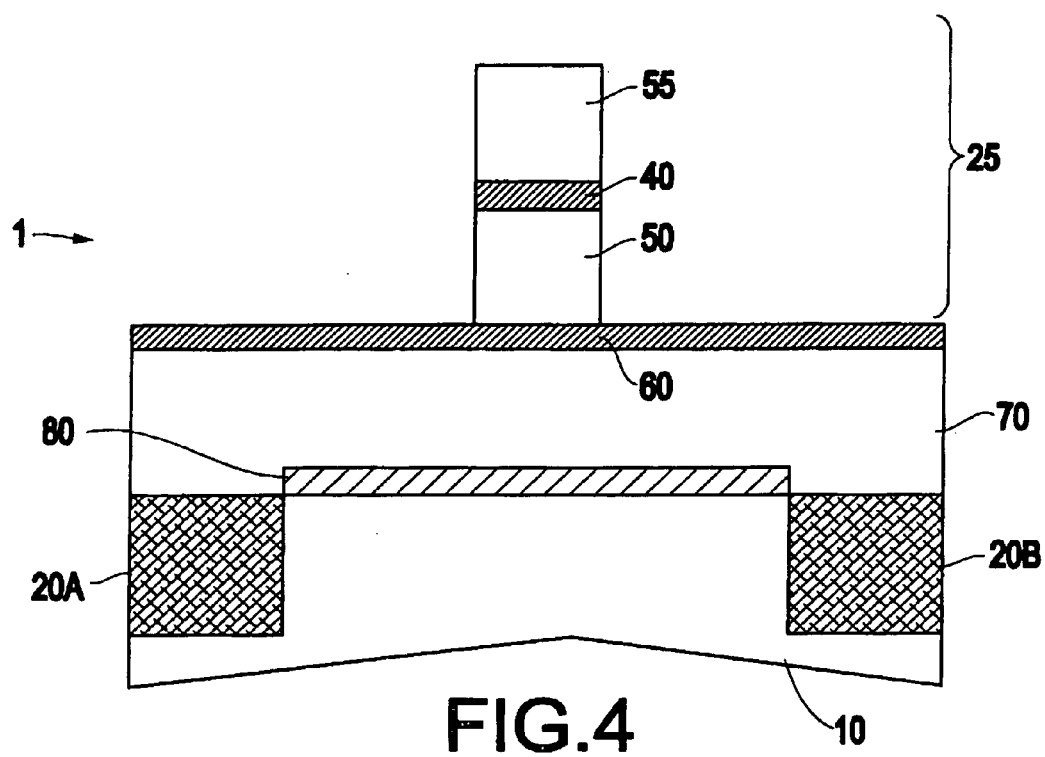
FIG. 4 is a cross-sectional schematic diagram of a partially completed CMOS device according to the present invention.

FIG. 4 shows the gate conductor 70 being patterned by first coating a layer of photosensitive material, e.g. photoresist, and then by conducting a conventional photolithographic process to form an etching mask 55. The composite material is patterned by etching selected regions of the second nitride layer 40 and oxide layer 50.

Figure 5:
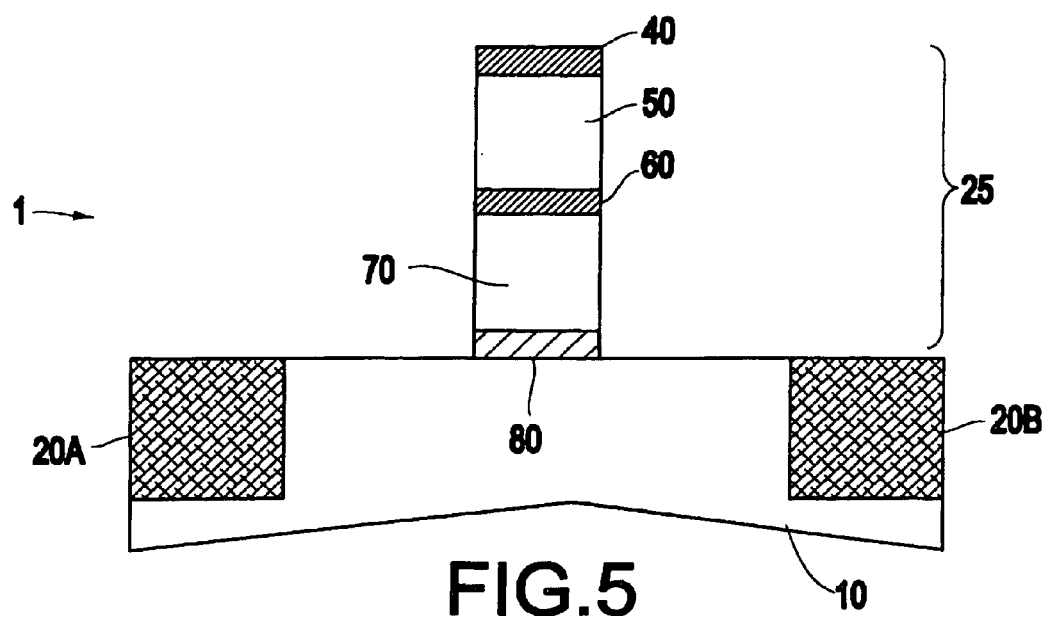
FIG. 5 is a cross-sectional schematic diagram of a partially completed CMOS device according to the present invention.

Next, as depicted in FIG. 5, the composite gate stack 25 is further etched to remove the first nitride layer 60, the polysilicon gate conductor 70, and the exposed gate dielectric material 80, leaving only a stacked portion 25 of the gate dielectric 80, gate conductor 70, first and second nitride layers 60, 40, and the oxide layer 50. Furthermore, the etching mask 55 is removed. The composite 25 is thus patterned in a manner exposing the substrate 10 and the shallow trench isolation regions 20A, 20B.

Figure 6:
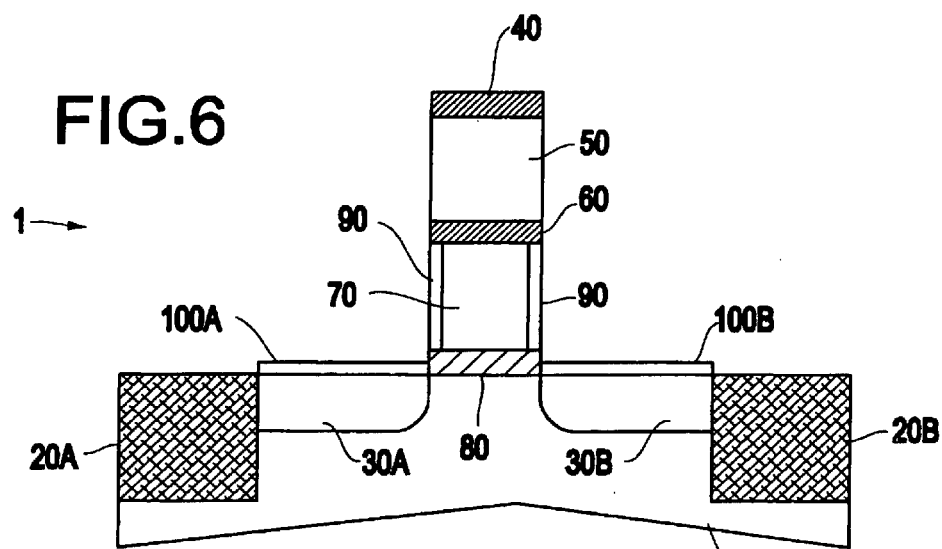
FIG. 6 is a cross-sectional schematic diagram of a partially completed CMOS device according to the present invention.
Figure 7:
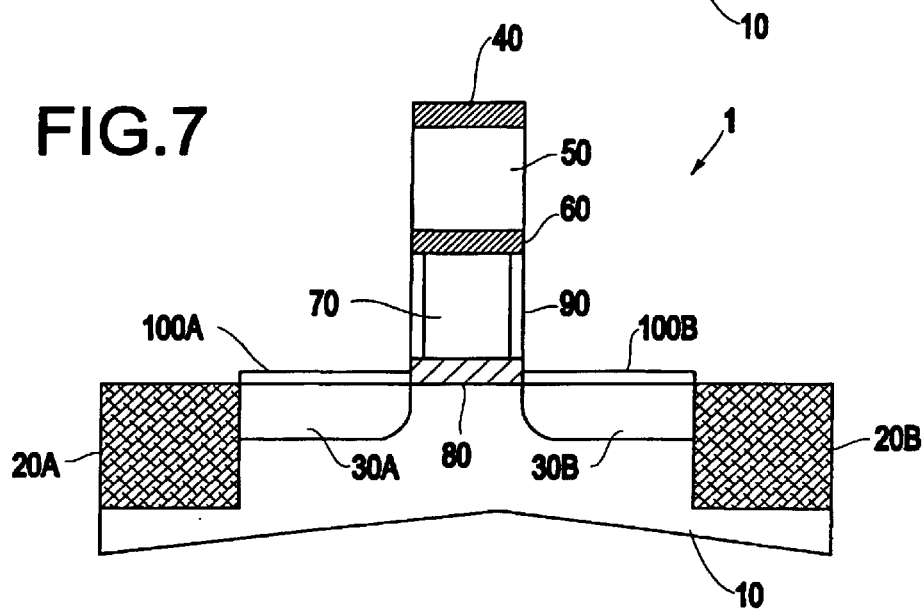
FIG. 7 is a cross-sectional schematic diagram of a partially completed CMOS device according to the present invention.

FIGS. 6 and 7 show the MOS device 1 after a cleaning step, wherein a thin oxide (e.g., 50–200A) is deposited on the exposed gate conductor sidewalls 90 and surfaces 100A, 1001B of the source and drain areas 30A, 30B.

Then, as shown in FIG. 6, lightly doped source/drain areas 30A, 30B are formed by implanting the structure 1 with a proper doping, dosage and energy. For shallow p-doping, it is preferable to ion implant iridium, boron, or $BF_2$, for example, with an energy level of 2 to 10 keV, and a dose of $1 \times 10^{13}$ to $1 \times 10^{14}$ ions/cm$^2$. Deep doping is performed at a higher voltage and dosage, for example, by implanting boron or $BF_2$ with an energy level of 5 to 60 keV, and a dose of $2 \times 10^{15}$ to $8 \times 10^{15}$ ions/cm$^2$. N doping is achieved by substituting the above ions with either arsenic or phosphorus at an energy between 2 to 100 keV.

Figure 8:
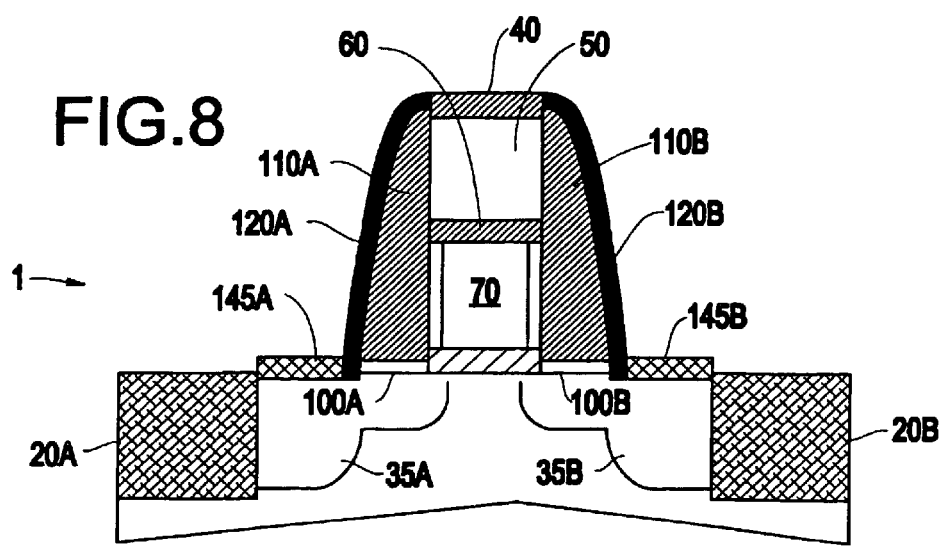
FIG. 8 is a cross-sectional schematic diagram of a partially completed CMOS device according to the present invention.

In FIG. 8, a sidewall spacer process is carried out to form nitride spacers 110A, 110B, followed by a thin, uniform layer of oxide material 120A, 120B deposited thereon. An additional source/drain implant is carried out to form more heavily doped nMOS and pMOS source/drain junctions 35A, 35B. The uniform coating of oxide material 120A, 120B is important, especially when a silicide process subsequently follows. The silicide junctions 145A, 145B are preferably self-aligned by the nitride spacers 110A, 110B.

Figure 9:
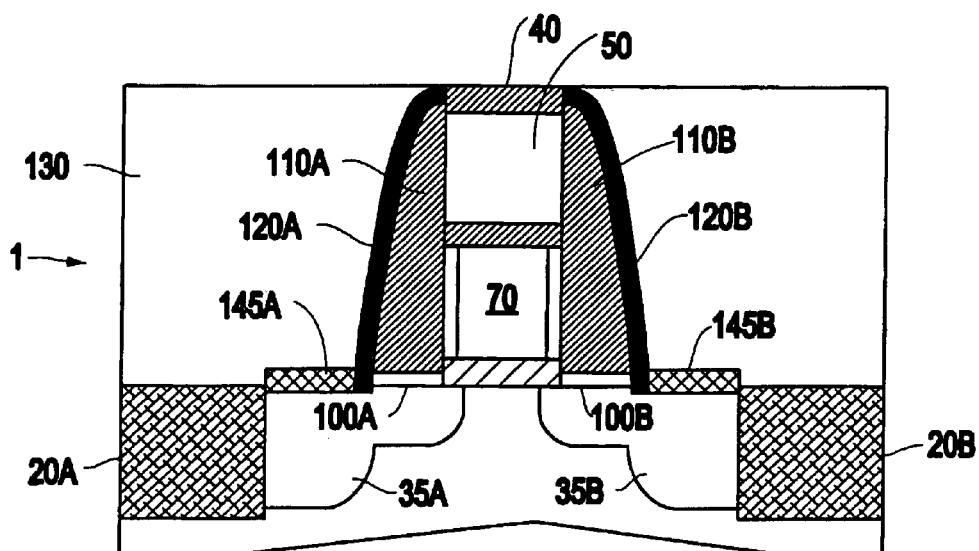
FIG. 9 is a cross-sectional schematic diagram of a partially completed CMOS device according to the present invention.
Figure 10:
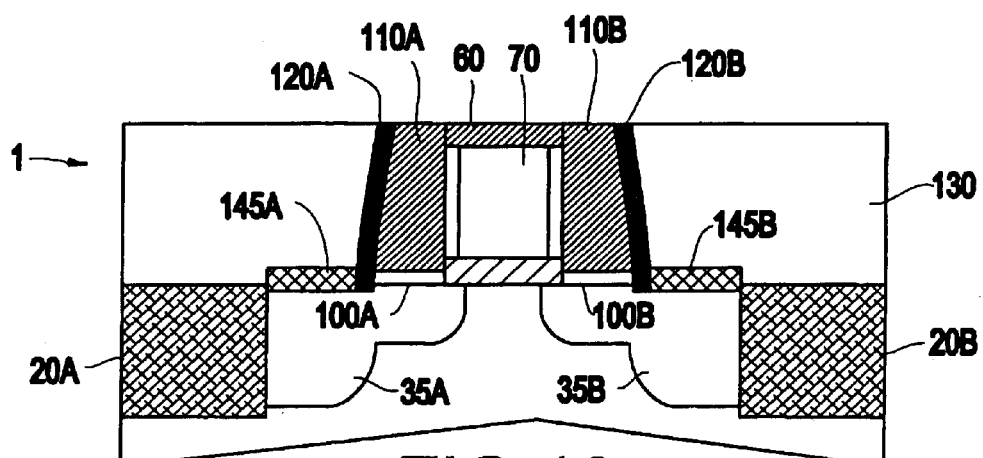
FIG. 10 is a cross-sectional schematic diagram of a partially completed CMOS device according to the present invention.

FIG. 9 shows a proper insulating material 130, such as CVD oxide, deposited on the device 1 and planarized. Next, as illustrated in FIG. 10, a controlled planarization process is carried out to remove the second nitride layer 40 and oxide layer 50 from the gate stack 25. The planarization process stops at the first nitride layer 60. A chemical-mechanical polish with end-point detection capabilities is useful in this stage of the process.

Figure 11:
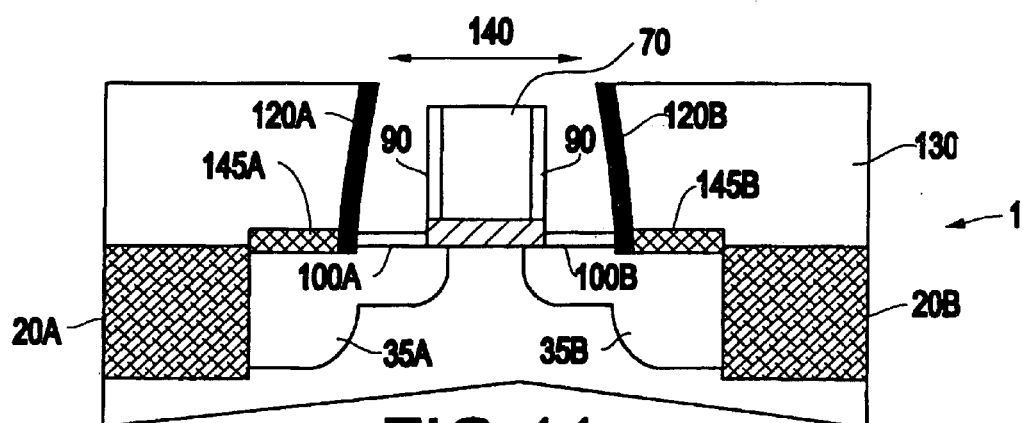
FIG. 11 is a cross-sectional schematic diagram of a partially completed CMOS device according to the present invention.
Figure 12:
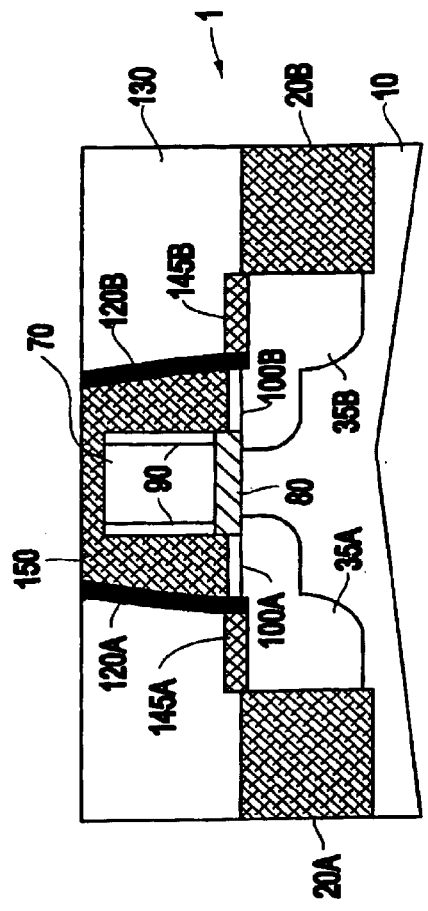
FIG. 12 is a cross-sectional schematic diagram of a completed CMOS device according to the present invention.

FIG. 11, shows the exposed first nitride layer 60 as well as the remaining nitride spacers 110A, 110B, being selectively removed thereby creating a void 140 around the gate conductor 70. Next, FIG. 12 illustrates a highly conductive material (e.g., metal) 150 deposited to fill the void 140. Metals 150 including tungsten (W), tungsten nitride (WN), cobalt (Co), nickel (Ni), rhenium (Re), titanium (Ti), titanium nitride (TiN), ruthenium (Ru), ruthenium dioxide ($RuO_2$), iridium (Ir), platinum (Pt), tantalum (Ta), tantalum nitride (TaN), tantalum silicone nitride ($TaSi_xN_y$), and alloys and compounds thereof may be deposited using methods such as atomic level deposition (ALD) and chemical vapor deposition (CVD). Metals such as chromium (Cr), manganese (Mn), aluminum (Al), palladium (Pd), copper (Cu), gold (Au), and alloys and compounds thereof may be deposited using directional PVD to fill 150 the void 140. A chemical-mechanical polish process is then performed to planarize the metal 150. The metal spacers 150 contact the polysilicon gate 70 on the top but are isolated from the gatesides by oxide 90 and from the source/drain junctions 35A, 35B by conformal oxide layer 120A, 120B and the pad oxide layer 100A, 100B.

The processing methods for the conformal fill of void 140 include either metal organic CVD or atomic layer CVD. Both, metallic materials (i.e. TiN, TaN, NbN, MoN, $WSi_x$, $TiSi_2$, $CoSi_2$) and elemental metals (e.g. Co, Ti, Cu, Ta, W, V, Ru), work well with the invention. The primary criteria for utilization is a conformal film, good adhesion, and limited contamination with oxygen, carbon, and residual organic ligands from the cation's precursor. Typical processing conditions for metal organic chemical vapor deposition (MOCVD) techniques utilize temperatures of less than 600° C. at operating pressures between $10^{-3}$ and 10 Torr. Base pressures to be achieved should be on the order of $10^{-6}$ to $10^{-8}$ Torr. Flow rates of the source gases are specific to the metal chosen and must be determined for each set of parameters employed.

The sidewall insulator 90 is an optional feature that prevents the metal spacers 150 from altering the work function. In alternative embodiments, the metal spacers can surround the entire gate conductor (make contact along the full length of the sides and over the full top), make contact only along the sides (e.g., be removed from the top by CMP, etc.), or contact just a portion of each of the sides and the top. The amount of contact made between the gate conductor and the metal spacers is selected by the designer to balance the decrease in sheet resistance with the change in work function.

Figure 13:
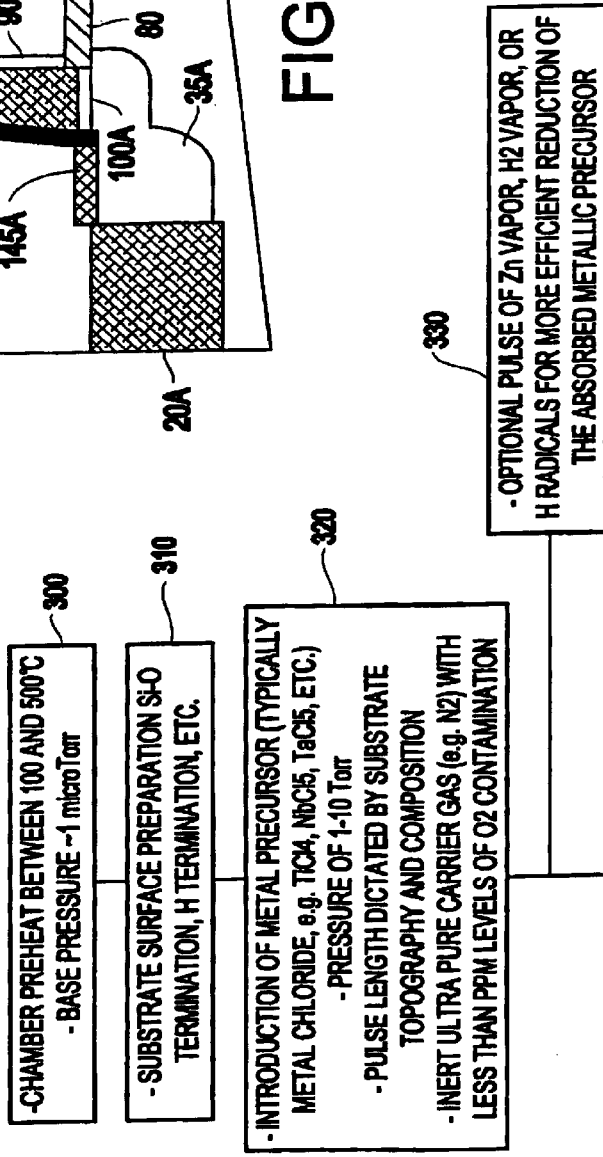
FIG. 13 is a flow diagram illustrating a metal film deposition process.

The flowchart given in FIG. 13 provides more specific details of the deposition of metal 150 in voids 140 and synthesis of metal nitrides by atomic level deposition (ALD). Forming nitrides via the ALD technique generates electrical resistivities in the range from 50 to 500 $\mu\Omega$-cm.

It should be noted that although the process is illustrated with metal chloride and ammonia type precursors, alternative chemistries for both the metal cation and the nitrogen anion may be employed (e.g, beta-diketonates, alkoxides, tert-butoxides, $N_2$, N-radicals, etc.). The process begins 300 by preheating a chamber between 100° C. and 500° C., at a base pressure of 1 microTorr. Next, the substrate surface is prepared 310 along with a silicon oxide termination, or hydrogen termination, etc. For example, for Si—O terminated surface, use Huang AB, and for H terminated surface, use HF.

Then, the metal precursor is introduced 320, which is typically metal chloride (e.g., $TiCl_4$, $NbCl_5$, $TaCl_5$, etc.). The base pressure is set between 1–10 Torr. The pulse length is dictated by the substrate topography and composition. Also, an inert, ultra pure carrier gas is applied (e.g., $N_2$) with less than 2 ppm levels of $O_2$ contamination.

Optionally, a pulse of zinc (Zn) vapor, $H_2$ vapor, or H radicals is applied 330 for a more efficient reduction of the adsorbed metallic precursor. Then, $NH_3$ gas is introduced 340 with a purity better than 99.999%, and at a pressure of 1–10 Torr. The pulse length is dictated by the film topography and composition. Finally, the precursor deposition and oxidation is repeated 350 until the desired film thickness is obtained.

Figure 14:
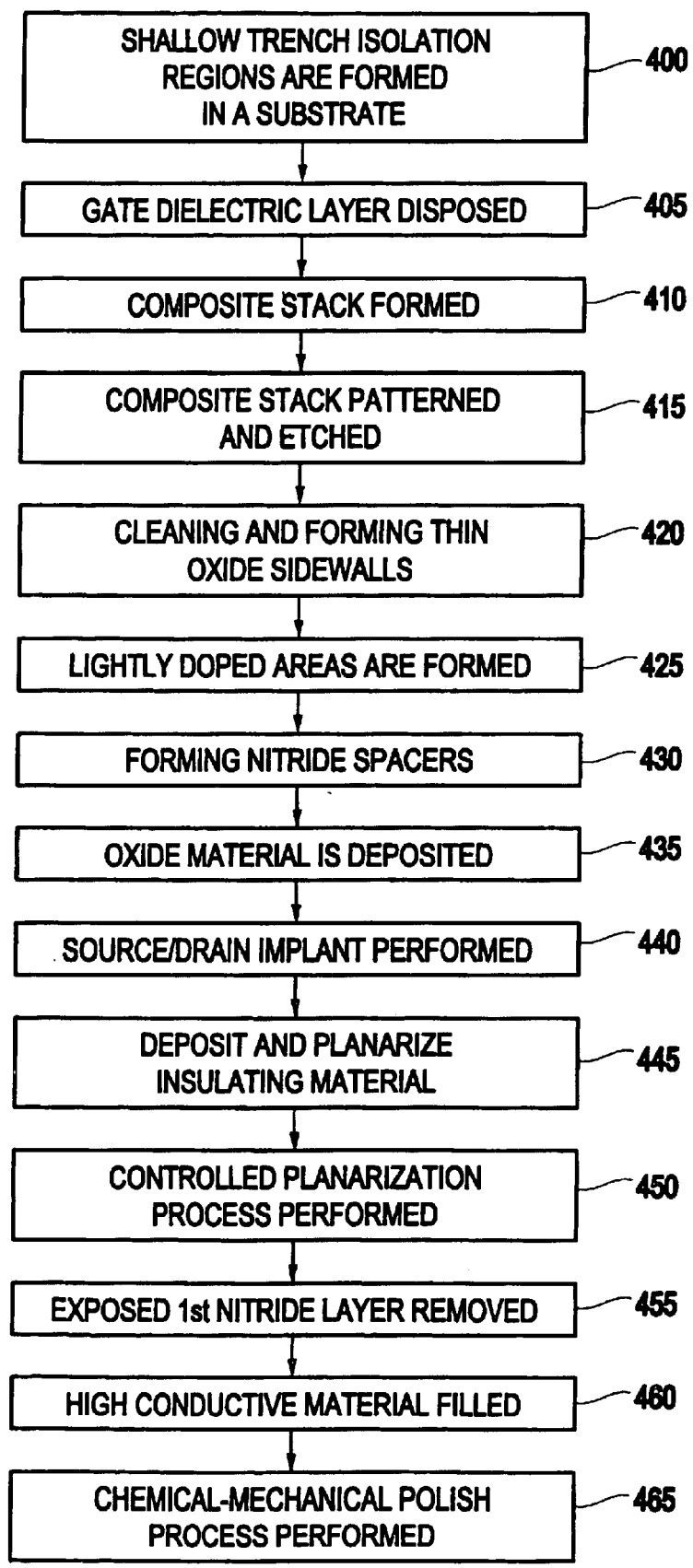
FIG. 14 is a flow diagram illustrating a preferred method of the invention.

In FIG. 14, the process of forming the CMOS device 1 is shown in flowchart form. First, using a semiconductor substrate 10, shallow trench isolation regions 20A, 20B are formed therein 400. Second, a gate dielectric layer 80 is disposed thereon 405. Next, a composite stack 25 is formed 410, comprising a gate conductor 70, first nitride layer 60, oxide layer 50, and a second nitride layer 40. Then, the composite stack 25 is patterned and etched 415 in addition to the gate dielectric layer 80.

The next step involves cleaning the device 1, and then forming 420 a pair of thin oxide sidewall insulators 90 on each side of the exposed gate conductor surface 70 and surfaces 100A, 100B of the source and drain areas 30A, 30B. Upon completion of this step, lightly doped areas are formed 425 by implanting the structure 1 in the source and drain regions 30A, 30B with a proper doping, dosage and energy.

Next, a conventional sidewall spacer process is carried out 430 to form nitride spacers 110A, 110B. Next, a thin layer of oxide material 120A, 120B is deposited 435 on the nitride spacers 110A, 110B. Then, a conventional source/drain implant is performed 440 to form the nMOS and pMOS source/drain junctions 35A, 35B. The next step is to deposit and planarize 445 an insulating material 130, such as CVD oxide. Then, a controlled planarization process is performed 450 to remove the second nitride layer 40 and the oxide layer 50 from the gate stack 25.

Next, the exposed first nitride layer 60 and the spacers 110A, 110B are selectively removed 455, thereby creating a void 140 around the gate conductor 70. After which, a high conductive material 150 fills 460 the void 140. Finally, a chemical-mechanical polish process if performed 465 to planarize the metal 150.

Conventional structures use either a metal gate or poly gate. The invention uses a polysilicon claded by a metal spacer. This combines the advantages of lower contact resistance (metal clad to assist current conduct), and minimal work function difference (polysilicon gate) between the gate conductor and channel of the FET.

Thus, with the metallic spacers connected to the polysilicon gate, the present invention obtains a much lower overall gate sheet resistance, and thus has smaller timing delays compared to the prior art devices. The present invention provides metallic spacers, which have widths less than the design ground rule, which in turn, enables sub-minimum lithographic wiring to be realized.

For ease of understanding and simplicity of detailing, the figures show a single MOS device. However, it is well understood, and is well recognized in the art that the present invention is equally applicable to a complementary (CMOS) device. While the invention has been described in terms of preferred embodiments, those skilled in the art will recognize that the invention can be practiced with modification within the spirit and scope of the appended claims.

What is claimed is:

1. A metal oxide semiconductor device comprising:
   a substrate;
   source and drain regions in said substrate;
   a polysilicon gate conductor over said substrate; and
   metallic spacers surrounding said gate conductor and isolated from said source and drain regions,
   wherein said metallic spacers comprise a uniform materials and contact a top portion of said gate conductor, and have a height greater than a height of said gate conductor.

2. The device in claim 1, further comprising an insulator along sides of said gate conductor separating said metallic spacers from said sides of said gate conductor, wherein said metallic spacers contact said gate conductor only along a top portion of said gate conductor.

3. The device of claim 1, wherein said metallic spacers comprise one of W, WN, Co, Ni, Re, Ti, TiN, Ru, $RuO_2$, Ir, Pt, Ta, TaN, TaSiN, Cr, Mn, Al, Pd, Cu, Au, and a combination thereof.

4. The device of claim 1, wherein said metallic spacers have a sheet resistance in the range of 2–5 Ohms/Sq.

5. The device of claim 1, further comprising an insulator separating said metallic spacers from said source and drain regions.

6. The device of claim 1, wherein said metallic spacers lower a sheet resistance of said gate conductor.

7. The device in claim 1, further comprising source and drain regions in said substrate, and a gate dielectric layer over a portion of said source and drain regions and said substrate.

8. A metal oxide semiconductor transistor comprising:
   a substrate;
   a well region in said substrate;
   source and drain regions on opposite sides of said well region in said substrate;
   a gate insulator over said well region of said substrate;
   a polysilicon gate conductor over said gate insulator; and
   metallic spacers surrounding said gate conductor and isolated from said source and drain regions,
   wherein said metallic spacers comprise a uniform material, contact a top portion of said gate conductor, and have a height greater than a height of said gate conductor.

9. The transistor in claim 8, further comprising an insulator along sides of said gate conductor separating said metallic spacers from said sides or said gate conductor, wherein said metallic spacers contact said gate conductor only along a top portion of said gate conductor.

10. The transistor of claim 8, wherein said metallic spacers comprise one of W, WN, Co, Ni, Re, Ti, TiN, Ru, $RuO_2$, Ir, Pt, Ta, TaN, TaSiN, Cr, Mn, Al, Pd, Cu, Au, and a combination thereof.

11. The transistor of claim 8, wherein said metallic spacers have a sheet, resistance in the range of 2–5 Ohms/Sq.

12. The transistor of claim 8, further comprising an insulator separating said metallic spacers from said source and drain regions.

13. The transistor of claim 8, wherein said metallic spacers lower a sheet resistance of said gate conductor.

14. The transistor in claim 8, further comprising a gate dielectric layer over a portion of said source and drain regions and said substrate.

15. A method of forming a metal oxide semiconductor device, said method comprising:
   forming source and drain regions in a substrate;
   forming a polysilicon gate conductor over said substrate;
   forming conductive metallic spacers on said gate conductor; and
   isolating said metallic spacers from said source and drain regions,
   wherein said metallic spacers comprise a uniform material and surround said gate conductor,
   wherein said metallic spacers contact a top portion of said gate conductor, and
   wherein said metallic spacers have a height greater than a height of said polysilicon gate conductor.

16. The method in claim 15, further comprising forming an insulator along sides of said gate conductor separating said metallic spacers from said sides of said gate conductor such that said metallic spacers contact said gate conductor only along a top portion of said gate conductor.

17. The method of claim 15, wherein said metallic spacers comprise one of W, WN, Ca, Ni, Re, Ti, TiN, Ru, $RuO_2$, Ir, Pt, Ta, TaN, TaSiN, Cr, Mn, Al, Pd, Cu, Au, and a combination thereof.

18. The method of claim 15, wherein said metallic spacers have a sheet resistance in the range of 2–5 Ohms/Sq.

19. The method of claim 15, further comprising forming an insulator separating said metallic spacers from said source and drain regions.

20. The method of claim 15, wherein said metallic spacers lower a sheet resistance of said gate conductor.

21. The method in claim 15, further comprising forming a gate dielectric layer over a portion of said source and drain regions and said substrate.

22. A method of forming a metal oxide semiconductor transistor, said method comprising:
   forming a well region in a substrate;
   forming source and drain regions on opposite sides of said well region in said substrate;
   forming a gate insulator over said well region of said substrate;
   forming a polysilicon gate conductor over said gate insulator;
   forming metallic spacers on said gate conductor; and
   isolating said metallic spacers from said source and drain regions,
   wherein said metallic spacers comprise a uniform material and surround said gate conductor,
   wherein said metallic spacers contact a top portion of said gate conductor, and
   wherein said metallic spacers have a height greater than a height of said polysilicon gate conductor.

23. The method in claim 22, further comprising forming an insulator along sides of said gate conductor separating said metallic spacers from said sides of said gate conductor such that said metallic spacers contact said gate conductor only along a top portion of said gate conductor.

24. The method of claim 22, wherein said metallic spacers comprise one of W, WN, Co, Ni, Re, Ti, TiN, Ru, $RuO_2$, Ir, Pt, Ta, TaN, TaSiN, Cr, Mn, Al, Pd, Cu, Au, and a combination thereof.

25. The method of claim 22, wherein said metallic spacers have a sheet resistance in the range of 2–5 Ohms/Sq.

26. The method of claim 22, further comprising forming an insulator separating said metallic spacers from said source and drain regions.

27. The method of claim 22, wherein said metallic spacers lower a sheet resistance of said gate conductor.

28. The method in claim 22, further comprising forming a gate dielectric layer over a portion of said source and drain regions and said substrate.

* * * * *